United States Patent
Yong

(10) Patent No.: US 9,406,655 B2
(45) Date of Patent: Aug. 2, 2016

(54) LIGHT EMITTING DIODE PACKAGING STRUCTURE AND LIQUID CRYSTAL DISPLAY DEVICE

(71) Applicant: Shenzhen China Star Optoelectronics Technology Co., Ltd., Guangdong (CN)

(72) Inventor: Fan Yong, Guangdong (CN)

(73) Assignee: SHENZHEN CHINA STAR OPTOELECTRONICS TECHNOLOGY CO., Guangdong (CN)

( * ) Notice: Subject to any disclaimer, the term of this patent is extended or adjusted under 35 U.S.C. 154(b) by 0 days.

(21) Appl. No.: 14/387,541

(22) PCT Filed: Jul. 5, 2014

(86) PCT No.: PCT/CN2014/081709
§ 371 (c)(1),
(2) Date: Sep. 23, 2014

(87) PCT Pub. No.: WO2015/192413
PCT Pub. Date: Dec. 23, 2015

(65) Prior Publication Data
US 2015/0371973 A1    Dec. 24, 2015

(30) Foreign Application Priority Data
Jun. 19, 2014  (CN) .......................... 2014 1 0274260

(51) Int. Cl.
*H01L 25/075*  (2006.01)
*H01L 33/56*  (2010.01)
*G02F 1/1335*  (2006.01)
*H01L 33/50*  (2010.01)
*H01L 23/00*  (2006.01)

(52) U.S. Cl.
CPC ...... *H01L 25/0753* (2013.01); *G02F 1/133603* (2013.01); *H01L 24/97* (2013.01); *H01L 33/502* (2013.01); *H01L 33/56* (2013.01); *H01L 2224/48091* (2013.01); *H01L 2224/48247* (2013.01); *H01L 2224/48257* (2013.01); *H01L 2933/0091* (2013.01)

(58) Field of Classification Search
None
See application file for complete search history.

(56) References Cited

U.S. PATENT DOCUMENTS

2010/0219770 A1* 9/2010 Kim .................... H01L 25/0753
                                                         315/294
2011/0291114 A1* 12/2011 Cheng ................. H01L 25/0753
                                                         257/88

FOREIGN PATENT DOCUMENTS

CN         103807665       *  5/2014

* cited by examiner

*Primary Examiner* — Ashok Patel
(74) *Attorney, Agent, or Firm* — WPAT, P.C., Intellectual Property Attorneys; Anthony King

(57) ABSTRACT

A light emitting diode packaging structure is disclosed, which has a first cup, a second cup, and a holder carried the first cup and the second cup; a blue light emitting chip is placed in the first cup, which is filled with a red emitting phosphor mixed with silicone, and a green light emitting chip is placed in the second cup, which is filled with a silicone, such that the energy consumption of G light caused by the red emitting phosphor absorbing G light in the conventional art can therefore be solved, and the lighting efficiency of the LED is increased.

5 Claims, 3 Drawing Sheets

LIGHT EMITTING DIODE PACKAGING STRUCTURE AND LIQUID CRYSTAL DISPLAY DEVICE

FIELD OF THE INVENTION

The present invention relates to the technical field of liquid crystal display panels, and in particular, relates to a light emitting diode packaging structure and a liquid crystal display device.

BACKGROUND OF THE INVENTION

Recently, in consideration of brightness, contrast, power consumption, life time, volume, and weight of comprehensive functions, the thin film transistor liquid crystal display (TFT-LCD) is the only display device that catches up and even surpasses the cathode ray tube display. TFT-LCD has the advantages of excellent performance, good mass production, and a degree of high automation, therefore it has quickly become the main product in the current market.

In the conventional art, color TFT-LCD devices mainly adopt light emitting diodes (LED) with yellow phosphor as their backlight, but the color saturation is not high enough after adopting LEDs with yellow phosphor. In order to improve color gamut and achieve the bright-colored performance of the LCD device, backlight sources have mainly adopted blue light emitting chips with red and green emitting phosphor (B chip+RG phosphor), blue and red light emitting chips with green phosphor (BR chip+G phosphor), or blue and green light emitting chips with red emitting phosphor (BG chip+R phosphor).

However, in practice, the inventor found that the conventional art has some problems: although the current technology of BG chips with R phosphor adopts an independent driving method for the BG chips, the LED energy performance is not generally high. One important reason is that the BG chips with R phosphor are packaged in the same cup, so that the R phosphor absorbs G light generated from the G chip. However, because the efficiency of G light exciting the R phosphor is very low, most of the G light energy is lost, and the G light has a strong effect on the LED luminous flux.

Therefore, it is necessary to provide a new technical solution to solve the above problem.

SUMMARY OF THE INVENTION

The objective of the present invention is to provide an LED packaging structure and an LCD device to enhance the lighting efficiency of the LED.

In order to solve the above problem, a technical solution according to one embodiment of the present invention is as follows:

An LED packaging structure comprises: a first cup; a second cup; and a holder carried the first cup and the second cup; wherein a blue light emitting chip is placed in the first cup, which is filled with a red emitting phosphor mixed with silicone, the red emitting phosphor is silicate, nitride, quantum dots, or sulfide; a green light emitting chip is placed in the second cup, which is filled with a silicone and scattering particles.

In the above mentioned LED packaging structure, a bottom portion of the holder comprises a metal holder, a bottom portion inside the first cup comprises a first wire and a first metal holder, the first metal holder is part of the metal holder, the blue light emitting chip is disposed on the first metal holder, the first wire is electrically connected to the blue light emitting chip and the first metal holder, respectively.

In the above mentioned LED packaging structure, a bottom portion inside the second cup comprises a second wire and a second metal holder, the second metal holder is part of the metal holder, the green light emitting chip is disposed on the second metal holder, and the second wire is electrically connected to the blue light emitting chip and the second metal holder, respectively.

In order to solve the above problem, a technical solution according to one embodiment of the present invention is as follows:

An LED packaging structure comprises: a first cup; a second cup; and a holder carried the first cup and the second cup; wherein a blue light emitting chip is placed in the first cup, which is filled with a red emitting phosphor mixed with silicone; a green light emitting chip is placed in the second cup, which is filled with a silicone.

In the above mentioned LED packaging structure, the second cup is further filled with scattering particles.

In the above mentioned LED packaging structure, the red emitting phosphor is silicate, nitride, quantum dots, or sulfide.

In the above mentioned LED packaging structure, a bottom portion of the holder comprises a metal holder, a bottom portion inside the first cup comprises a first wire and a first metal holder, the first metal holder is part of the metal holder, the blue light emitting chip is disposed on the first metal holder, the first wire is electrically connected to the blue light emitting chip and the first metal holder, respectively.

In the above mentioned LED packaging structure, a bottom portion inside the second cup comprises a second wire and a second metal holder, the second metal holder is part of the metal holder, the green light emitting chip is disposed on the second metal holder, the second wire is electrically connected to the blue light emitting chip and the second metal holder, respectively.

In order to solve the above problem, a technical solution according to another embodiment of the present invention is as follows:

A liquid crystal device comprises a backlight source and an LCD panel, wherein the backlight source has an LED packaging structure comprising: a first cup; a second cup; and a holder carried the first cup and the second cup; wherein a blue light emitting chip is placed in the first cup, which is filled with a red emitting phosphor mixed with silicone; a green light emitting chip is placed in the second cup, which is filled with a silicone.

In the above mentioned LCD device, the second cup is filled with scattering particles.

In the above mentioned LCD device, the red emitting phosphor is silicate, nitride, quantum dots, or sulfide.

In the above mentioned LCD device, a bottom portion of the holder comprises a metal holder, a bottom portion inside the first cup comprises a first wire and a first metal holder, the first metal holder is part of the metal holder, the blue light emitting chip is disposed on the first metal holder, the first wire is electrically connected to the blue light emitting chip and the first metal holder, respectively.

In the above mentioned LCD device, a bottom portion inside the second cup comprises a second wire and a second metal holder, the second metal holder is part of the metal holder, the green light emitting chip is disposed on the second metal holder, the second wire is electrically connected to the blue light emitting chip and the second metal holder, respectively.

Compared to the conventional art, the blue light emitting chip and the green light emitting chip are respectively packaged in two different cups in the LED packaging structure and in the LCD device provided by the present invention. The cup packaged with the blue light emitting chip is filled with the red emitting phosphor mixed with silicone, so as to prevent the red emitting phosphor from absorbing G light, the G light energy consumption problem can therefore be solved, and the lighting efficiency of the LED can be increased.

BRIEF DESCRIPTION OF THE DRAWINGS

Below, in conjunction with the accompanying drawings, the present invention is described in detail by way of specific embodiments, to enable the technological solution of the present invention and other beneficial effects to be obvious.

DETAILED DESCRIPTION OF THE PREFERRED EMBODIMENTS

Please refer to the drawings, in which similar components are represented by the same component symbol, the principles of the present invention are implemented in a suitable embodiment. The following description is based on illustrated specific embodiments of the present invention, which should not be construed as limitations for other specific embodiments that are not discussed in the present invention.

Figure 1:
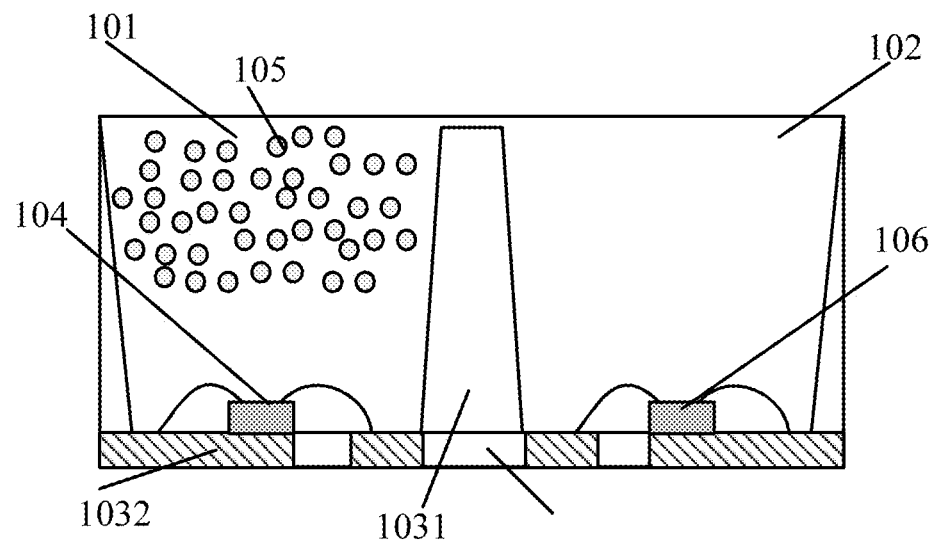
FIG. 1 is a schematic diagram of an LED packaging structure provided by the present invention.

Please refer to FIG. 1, which is a schematic diagram of an LED packaging structure according to one embodiment of the present invention. The LED packaging structure comprises: a first cup 101; a second cup 102; and a holder 103 carried the first cup 101 and the second cup 102; wherein a blue light emitting chip 104 is placed in the first cup 101, the first cup 101 is filled with a red emitting phosphor 105 mixed with silicone; a green light emitting chip 106 is placed in the second cup 102, and the second cup 102 is filled with a silicone.

It should be understood that the red emitting phosphor 105 can be silicate, nitride, quantum dots, or sulfide.

As shown in FIG. 1, a blue light emitting chip (B chip) 104 and a green light emitting chip (G chip) 106 are respectively packaged in two different cups in the LED packaging structure provided by the present invention. Moreover, the first cup 101 packaged with the blue light emitting chip 104 is also filled with the red light emitting phosphor (R phosphor) mixed with silicone. The second cup packaged with the green light emitting chip does not have phosphor, and is instead filled with the silicone (not shown in FIG. 1). Because the blue light emitting chip 104 and the green light emitting chip 106 are independently packaged, the energy consumption of G light caused by the red emitting phosphor 105 absorbing G light in the cup can therefore be solved, and the lighting efficiency of the LED is increased.

Figure 2:
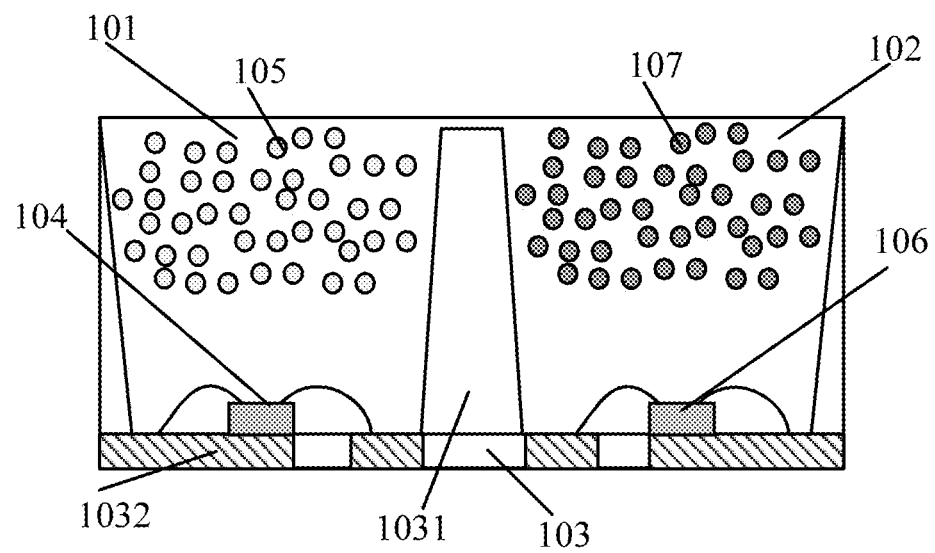
FIG. 2 is a schematic diagram of another LED packaging structure provided by the present invention.

Please also refer to FIG. 2, which is a schematic diagram according to another LED packaging structure provided by the present invention. Preferably, the second cup 102 is also filled with scattering particles 107.

It should be understood that in this embodiment, the second cup 102 packaged with the green light emitting chip 106 does not have phosphor, and is instead filled with the scattering particles 107 mixed with silicone. Because the scattering particles can enlarge the scattering angle of G light, the mixed lighting distance of G light, B light, and R light is reduced, further enhancing the lighting efficiency of the LED.

Further preferably, as shown in FIGS. 1 and 2, the holder 103 comprises a plastic holder 1031 and a metal holder 1032, where the plastic holder 1031 is disposed between the first cup 101 and the second cup 102, and the metal holder 1032 is disposed between bottom portions of the first cup 101 and the second cup 102, which means that the metal holder 1032 is disposed on a bottom portion of the holder 103.

Figure 3:
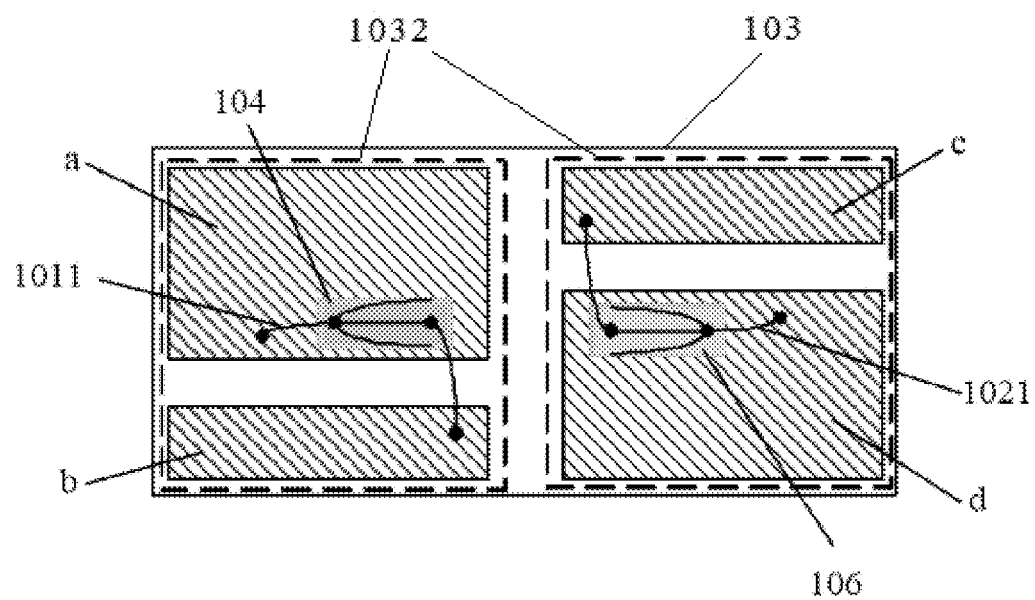
FIG. 3 is a structure diagram corresponding to a cross sectional view of FIG. 1.

FIG. 3 is a structure diagram of the metal holder 1032 in the LED packaging structure. The bottom portion inside the first cup 101 comprises a first wire 1011 and a metal holder, where the first metal holder is part of the metal holder 1032. The bottom portion inside the second cup 102 comprises a second wire 1021 and a second metal holder, where the second metal holder is part of the metal holder 1032. As shown in FIG. 3, a and b are the first metal holders, c and d are the second metal holders.

In the first cup 101, the blue light emitting chip 104 is disposed on the first metal holder. The first wire 1011 is electrically connected to the blue light emitting chip 104 and the first metal holder, respectively. As shown in FIG. 3, the blue light emitting chip 104 is disposed on the first metal holder a. The first wire 1011 is disposed on the blue light emitting chip 104. One pin of the first wire 1011 is connected to the first metal holder a, another pin is connected to the first metal holder b.

In the second cup 102, the green light emitting chip 106 is disposed on the second metal holder. The second wire 1021 is electrically connected to the green light emitting chip 106 and the second metal holder, respectively. As shown in FIG. 3, the green light emitting chip 106 is disposed on the second metal holder d, the second wire 1021 is disposed on the green light emitting chip 106. One pin of the second wire 1021 is connected to the second metal holder c, another pin of the second wire 1021 is connected to the second metal holder d.

Figure 4:
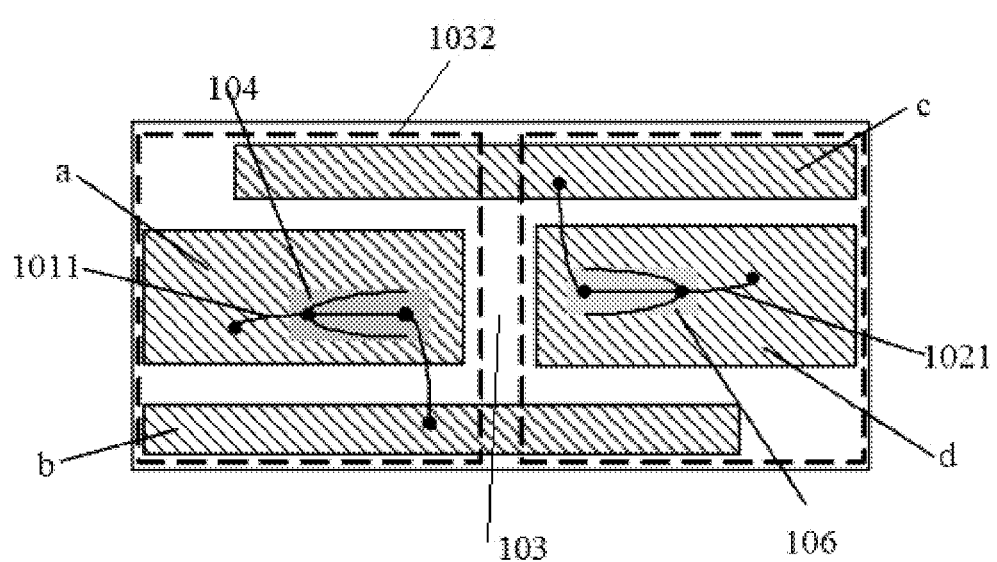
FIG. 4 is a structure diagram corresponding to a cross sectional view of FIG. 2.

In one preferred embodiment, the first holder b can pass through the middle region of the plastic holder 1031, and extend to a place below the second metal holder d. Also, the second metal holder c can pass through the middle region of the plastic holder 1031, and extend to a place above the first metal holder a. That is, the first metal holders and the second metal holders interact in the middle region of the plastic holder 1031. As shown in FIG. 4, which is another structure diagram of the metal holder 1032 in the LED packaging structure, the metal holder 103 is disposed on a middle bottom portion of the packaging structure, such that the strength of the packaging structure can be enhanced, and is not fractured easily.

It should be understood that in the present embodiment, the metal holder 103 and the wire can be disposed in other ways. For example, one pin of the first wire 1011 is connected to the first metal holder a, and another pin of the first wire 1011 is connected to the second metal holder c. Correspondingly, one pin of the second wire 1021 is connected to the second metal holder b, another pin of the second wire 1021 is connected to the second metal holder d. Here only FIG. 3 and FIG. 4 are illustrated, which does not restrict the claim scope of the present invention.

Furthermore, preferably, in the preferred embodiment of the present invention, the blue light emitting chip 104 and the green light emitting chip 106 are packaged respectively in two different cups, and the blue light emitting chip 104 and the green light emitting chip 106 are driven independently. In particular, the Pulse-Width Modulation (PWM) driving method is used to modulate the mark-space ratio of the LED driving current for adjusting chrominance. For example, when the y value in the CIE coordinates of the LED is small, here y=A, and the conditions require that y has to be at least greater than A, then the mark-square ratio of the driving current of the green light emitting chip 106 can be adjusted to be higher.

In conventional double chips LEDs, in which the two chips are basically connected in parallel or in series, the driving method is not able to provide the two LEDs with different driving currents or mark-square ratios. The present invention is able to drive the blue light emitting chip 104 and the green light emitting chip 106 independently by minor adjustments to the driving current. At the same time, the independent chip driving method of the light emitting packaging structure can also be applied in time driving backlight field, so as to achieve color sequential display.

It is easy to think that, in order to satisfy the white-dot chromaticity requirement of the TFT-LCD module, a centrifugal precipitation is processed after filling silicone mixed with the phosphor into the LED, such that it not only accelerates the precipitation of the LED phosphor, but also improves the yield of chroma bins.

According to the above, the present invention provides an LED packaging structure in which the blue light emitting chip (B chip) 104 and the green light emitting chip (G chip) 106 are respectively packaged in two different cups, and the first cup 101 packaged with the blue light emitting chip 104 is filled with the red emitting phosphor (R phosphor) 105 mixed with silicone, so as to prevent the red emitting phosphor from absorbing G light, the G light energy consumption problem can therefore be solved, and the lighting efficiency of the LED can be increased. Furthermore, the driving current can undergo minor adjustments to drive the blue light emitting chip 104 and the green light emitting chip 106 independently. The present invention is mainly applied in the backlight fields of high gamut LCD devices having RGB color filters and LCD devices with color sequential displays.

For a better execution of the LED packaging structure provided by the present invention, the present invention further provides an LCD device comprising the mentioned LED packaging structure. The meaning of the terms used below is the same as in the LED packaging structure as mentioned above. For specific implementation details, refer to the embodiments of the LED packaging structure.

Figure 5:
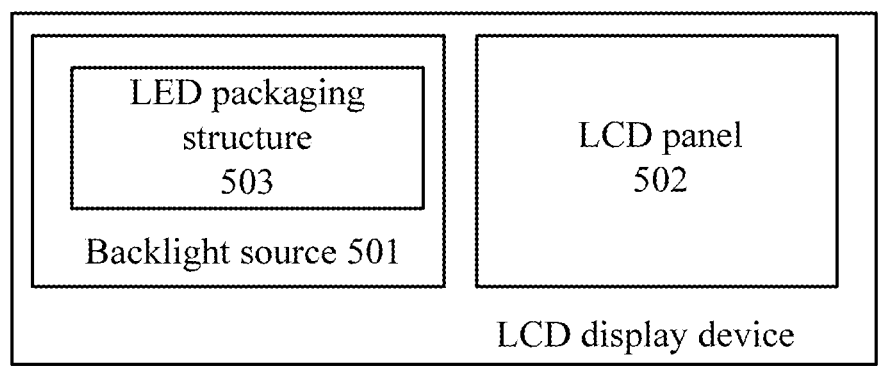
FIG. 5 is a schematic diagram of an LCD device provided by an embodiment of the present invention.

Please refer to FIG. 5, which is a schematic diagram of an LCD device according to one embodiment of the present invention. The device comprises a backlight source 501 and an LCD panel 502, where the backlight source 501 comprises an LED packaging structure 503. The LED packaging structure 503, as shown in FIGS. 1 and 3, comprises: a first cup 101; a second cup 102; and a holder 103 which carried the first cup 101 and the second cup 102; wherein a blue light emitting chip 104 is placed in the first cup 101, the first cup 101 is filled with a red emitting phosphor 105 mixed with silicone; a green light emitting chip 106 is placed in the second cup 102, and the second cup 102 is filled with a silicone.

It should be understood that the red emitting phosphor can be silicate, nitride, quantum dots, or sulfide.

Preferably, the second cup 102 is further filled with scattering particles 107.

It should be understood that in this embodiment the second cup 102 packaged with the green light emitting chip 106 does not have phosphor, and is instead filled with the scattering particles 107 mixed with silicone. Since the scattering particles can enlarge the scattering angle of G light, the mixed lighting distance of G light, B light, and R light is reduced, further enhancing the lighting efficiency of the LED.

Furthermore, preferably, the holder 103 comprises a plastic holder 1031 and a metal holder 1032, where the plastic holder 1031 is disposed between the first cup 101 and the second cup 102, and the metal holder 1032 is disposed on a bottom portion of the first cup 101 and the second cup 102, which means that the metal holder 1032 is disposed on a bottom portion of the holder 103.

FIG. 3 is a structure diagram of the metal holder 1032 in the LED packaging structure. The bottom portion inside the first cup 101 comprises a first wire 1011 and a metal holder, where the first metal holder is part of the metal holder 1032. The bottom portion inside the second cup 102 comprises a second wire 1021 and a second metal holder, where the second metal holder is part of the metal holder 1032. As shown in FIG. 3, a and b are the first metal holders, c and d are the second metal holders.

In the first cup 101, the blue light emitting chip 104 is disposed on the first metal holder. The first wire 1011 is electrically connected to the blue light emitting chip 104 and the first metal holder, respectively. As shown in FIG. 3, the blue light emitting chip 104 is disposed on the first metal holder a, and the first wire 1011 is disposed on the blue light emitting chip 104. One pin of the first wire 101 is connected to the metal holder a, another pin is connected to the first metal holder b.

In the second cup 102, the green light emitting chip 106 is disposed on the second metal holder. The second wire 1021 is electrically connected to the green light emitting chip 106 and the second metal holder, respectively. As shown in FIG. 3, the green light emitting chip 106 is disposed on the second metal holder d, the second wire 1021 is disposed on the green light emitting chip 106. One pin of the second wire 1021 is connected to the second metal holder c, another pin of the second wire 1021 is connected to the second metal holder d.

In one preferred embodiment, the first holder b can pass through the middle region of the plastic holder 1031, and extend to a place below the second metal holder d. Also, the second metal holder c can pass through the middle region of the plastic holder 1031, and extend to a place above the first metal holder a. As shown in FIG. 4, which is another structure diagram of the metal holder 1032 in the LED packaging structure, the metal holder 103 is disposed on a middle bottom portion of the packaging structure, such that the strength of the packaging structure can be enhanced, and is not fractured easily.

It should be understood that in the present embodiment, the metal holder 103 and the wire can be disposed in other ways. For example, one pin of the first wire 1011 can be connected to the first metal holder a, and another pin of the first wire 1011 can be connected to the second metal holder c. Correspondingly, one pin of the second wire 1021 can be connected to the second metal holder b, and another pin of the second wire 1021 can be connected to the second metal holder d. Here, only FIG. 3 and FIG. 4 are illustrated, which does not restrict the claim scope of the present invention.

Furthermore, preferably, in the preferred embodiment of the present invention, the blue light emitting chip 104 and the green light emitting chip 104 are packaged respectively in two different cups, and the blue light emitting chip 104 and the green light emitting chip 105 are driven independently. In particular, the Pulse-Width Modulation (PWM) driving method is used to modulate the mark-space ratio of the LED driving current for adjusting chrominance. For example, when the y value in the CIE coordinates of the LED is small, here y=A, and the conditions require that y has to be at least greater than A, then the mark-square ratio of the driving current of the green light emitting chip 106 can be adjusted to be higher.

In conventional double chips LEDs, the two chips are basically connected in parallel or in series, and the driving method is not able to provide the two LEDs with different driving currents or mark-square ratios. The present invention is able to drive the blue light emitting chip 104 and the green light emitting chip 106 independently by minor adjustments to the driving current. At the same time, the independent chip driving method of the light emitting packaging structure can also be applied in time driving backlight field, so as to achieve color sequential display.

It is easy to think that in order to satisfy the white-dot chromaticity requirement of the TFT-LCD module, a centrifugal precipitation is proceed after filling silicone mixed with the phosphor into the LED, which not only accelerates the precipitation of the LED phosphor, but also improves the yield of chroma bins.

According to the above, the present invention provides an LED packaging structure in which the blue light emitting chip 104 and the green light emitting chip 106 are respectively packaged in two different cups, and the first cup 101 packaged with the blue light emitting chip 104 is filled with the red emitting phosphor 105 mixed with silicone, so as to prevent the red emitting phosphor from absorbing G light. The G light energy consumption problem can thereby be solved, and the lighting efficiency of the LED can be increased. Furthermore, the driving current, by minor adjustments, can drive the blue light emitting chip 104 and the green light emitting chip 106 independently. The present invention is mainly applied in the backlight fields of high gamut LCD devices having RGB color filters and LCD devices with color sequential displays.

In the above embodiments, the descriptions of the various embodiments have different emphases; parts without a detailed description in a certain embodiment can be referred to the detailed descriptions above, and will not be repeated herein.

A person skilled in the art will recognize that the word "preferred" used herein means serving as an example, instance, or illustration. Any aspect or design described herein as "preferred" is not necessarily to be construed as advantageous over other aspects or designs. Rather, use of the word "preferred" is intended to present concepts in a concrete fashion. As used in this application, the term "or" is intended to mean an inclusive "or" rather than an exclusive "or". That is, unless specified otherwise, or clear from context, "X employs 101 or 102" is intended to mean any of the natural inclusive permutations. That is, if X employs 101; X employs 102; or X employs both 101 and 102, then "X employs 101 or 102" is satisfied under any of the foregoing instances.

Moreover, despite one or more implementations relative to the present disclosure being illustrated and described, equivalent alterations and modifications will occur to others skilled in the art upon reading and understanding this specification and the annexed drawings. The present disclosure comprises such modifications and variations, and is to be limited only by the terms of the appended claims. In particular, regarding the various functions performed by the above described components, the terms used to describe such components (i.e. elements, resources, etc.) are intended to correspond (unless otherwise indicated) to any component, which performs the specified function of the described component (i.e., that is, functionally equivalent), even though not structurally equivalent to the disclosed structure which performs the function in the illustrated implementations of the disclosure. In addition, although a particular feature of the disclosure may have been disclosed with respect to only one of several implementations, such a feature may be combined with one or more other features of the other implementations as may be desired and advantageous for any given or particular application. Also, to the extent that the terms "including", "includes", "having", "has", "with", or variants thereof are used in the detailed description or in the claims, such terms are intended to be inclusive in a manner similar to the term "comprising".

As is understood by a person skilled in the art, the foregoing preferred embodiments of the present invention are illustrative, rather than limiting, of the present invention. It is intended that they cover various modifications, and similar arrangements be included within the spirit and scope of the appended claims, the scope of which should be accorded the broadest interpretation so as to encompass all such modifications and similar structures.

What is claimed is:

1. A liquid crystal device comprising a backlight source and a liquid crystal display panel, wherein the backlight source has a light emitting diode packaging structure comprising:
    a first cup;
    a second cup; and
    a holder carried the first cup and the second cup; wherein a blue light emitting chip is placed in the first cup, which is filled with a red emitting phosphor mixed with silicone;
    a green light emitting chip is placed in the second cup, which is filled with a silicone;
    wherein the holder comprises a plastic holder, where a left side and a right side of the plastic holder contact with the first cup and the second cup, a bottom of the plastic holder contacts with a metal holder.

2. The liquid crystal device as claimed in claim 1, wherein the second cup is further filled with scattering particles.

3. The liquid crystal device as claimed in claim 1, wherein the red emitting phosphor is silicate, nitride, quantum dots, or sulfide.

4. The liquid crystal device as claimed in claim 1, wherein the metal holder is included in a bottom portion of the holder, a bottom portion inside the first cup comprises a first wire and a first metal holder, the first metal holder is part of the metal holder, the blue light emitting chip is disposed on the first metal holder, and the first wire is electrically connected to the blue light emitting chip and the first metal holder, respectively.

5. The liquid crystal device as claimed in claim 4, wherein a bottom portion inside the second cup comprises a second wire and a second metal holder, the second metal holder is part of the metal holder, the green light emitting chip is disposed on the second metal holder, and the second wire is electrically connected to the blue light emitting chip and the second metal holder, respectively.

\* \* \* \* \*